United States Patent
Walker et al.

(10) Patent No.: US 11,626,451 B2
(45) Date of Patent: Apr. 11, 2023

(54) MAGNETIC MEMORY DEVICE WITH RUTHENIUM DIFFUSION BARRIER

(71) Applicant: INTEL CORPORATION, Santa Clara, CA (US)

(72) Inventors: Emily Walker, Portland, OR (US); Carl H. Naylor, Portland, OR (US); Kaan Oguz, Portland, OR (US); Kevin L. Lin, Beaverton, OR (US); Tanay Gosavi, Hillsboro, OR (US); Christopher J. Jezewski, Portland, OR (US); Chia-Ching Lin, Portland, OR (US); Benjamin W. Buford, Hillsboro, OR (US); Dmitri E. Nikonov, Beaverton, OR (US); John J. Plombon, Portland, OR (US); Ian A. Young, Portland, OR (US); Noriyuki Sato, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 16/442,767

(22) Filed: Jun. 17, 2019

(65) Prior Publication Data
US 2020/0395406 A1    Dec. 17, 2020

(51) Int. Cl.
| | | |
|---|---|---|
| *H01L 27/22* | (2006.01) |
| *H01L 43/12* | (2006.01) |
| *G11C 11/16* | (2006.01) |
| *H01L 43/08* | (2006.01) |
| *H01L 43/02* | (2006.01) |
| *H01L 43/10* | (2006.01) |

(52) U.S. Cl.
CPC .......... *H01L 27/224* (2013.01); *G11C 11/161* (2013.01); *H01L 43/02* (2013.01); *H01L 43/08* (2013.01); *H01L 43/10* (2013.01); *H01L 43/12* (2013.01)

(58) Field of Classification Search
CPC ............................ H01L 27/224; G11C 11/161
See application file for complete search history.

(56) References Cited

U.S. PATENT DOCUMENTS

| | | | |
|---|---|---|---|
| 7,696,549 B2 * | 4/2010 | Ramesh ............ H01L 27/11507 257/295 |
| 9,666,256 B1 | 5/2017 | Lai et al. |

(Continued)

OTHER PUBLICATIONS

Bishnoi, et al., "Architectural Aspects in Design and Analysis of SOT-based Memories," IEEE, 19th Asia and South Pacific Design Automation Conference (ASP-DAC), Jan. 20-23, 2014. Date Added to IEEE Xplore Feb. 20, 2014. 8 pages.

(Continued)

*Primary Examiner* — Mamadou L Diallo
(74) *Attorney, Agent, or Firm* — Schwabe, Williamson & Wyatt, P.C.

(57) ABSTRACT

A magnetic memory device comprising a plurality of memory cells is disclosed. The memory device includes an array of memory cells where each memory cell includes a first material layer having a ferromagnetic material, a second material layer having ruthenium, and a third material layer having bismuth and/or antimony. The second material layer is sandwiched between the first material layer and the third material in a stacked configuration.

23 Claims, 8 Drawing Sheets (56) References Cited

U.S. PATENT DOCUMENTS

| | | | |
|---|---|---|---|
| 10,700,124 B1* | 6/2020 | Yang | H01L 27/224 |
| 2004/0061154 A1* | 4/2004 | Huai | B82Y 25/00 |
| | | | 257/E27.005 |
| 2009/0251950 A1* | 10/2009 | Klostermann | G11C 11/16 |
| | | | 365/158 |
| 2012/0091423 A1* | 4/2012 | Sumino | H01L 45/1286 |
| | | | 257/E47.001 |
| 2015/0041934 A1* | 2/2015 | Khvalkovskiy | H01L 27/224 |
| | | | 257/421 |
| 2017/0077394 A1* | 3/2017 | Saida | G11C 11/1659 |
| 2017/0309497 A1* | 10/2017 | Dieny | H01L 27/24 |
| 2018/0322994 A1* | 11/2018 | Rahman | G11C 11/161 |
| 2020/0040221 A1* | 2/2020 | Chih | C09G 1/04 |
| 2020/0144488 A1* | 5/2020 | Sundar | H01L 43/12 |
| 2020/0176042 A1* | 6/2020 | Wang | G11C 11/1675 |
| 2020/0176511 A1* | 6/2020 | Park | H01L 43/06 |
| 2020/0243603 A1* | 7/2020 | Lee | H01F 10/329 |
| 2020/0328344 A1* | 10/2020 | Saito | H01L 43/10 |
| 2021/0013397 A1* | 1/2021 | O'Brien | H01L 43/10 |

OTHER PUBLICATIONS

"Topological insulator," Wikipedia, URL: https://en.wikipedia.org/wiki/Topological_insulator, originally downloaded on Apr. 8, 2019. 6 pages.

* cited by examiner

MAGNETIC MEMORY DEVICE WITH RUTHENIUM DIFFUSION BARRIER

BACKGROUND

As electronic devices continue to become smaller and more complex, the need to store more data and access that data quickly similarly grows. New memory architectures have been developed that use an array of memory cells with ferromagnetic layers with adaptable tunnel magnetoresistance based on the relative orientation of the magnetization in the ferromagnetic layers. The different resistance values dictate whether a given memory cell stores a logic '0' or a logic '1'. Many challenges exist when fabricating such memory architectures.

BRIEF DESCRIPTION OF THE DRAWINGS

Features and advantages of embodiments of the claimed subject matter will become apparent as the following Detailed Description proceeds, and upon reference to the Drawings, in which:

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Magnetic memory cell designs are disclosed. The cells include a diffusion barrier provisioned between topological insulator and ferromagnetic materials to provide high efficiency magnetoelectronic memory cells, such as spin-orbit torque magnetic random-access memory (SOT MRAM) cells, spin-transfer torque (STT) MRAM cells, and magnetoelectronic spin-orbit (MESO) memory cells. A ruthenium thin film is deposited between a Group 15 (i.e., pnictogen group) thin film and a ferromagnetic material during film deposition. The stack is then annealed in an environment enriched with one or more chalcogen elements in order to convert the Group 15 thin film into a topologically insulating compound. In an example embodiment, the Group 15 thin film can be, for instance, bismuth (Bi) and/or antimony (Sb), and the one or more chalcogen elements can be, for instance, selenium (Se) or tellurium (Te). In such a case, annealing forms the topologically insulating compound of $(Bi,Sb)_2X_3$, where X is Se and/or Te. In any case, the ruthenium layer acts as a diffusion barrier for the one or more chalcogen elements, thus preventing or otherwise inhibiting diffusion of the chalcogen element(s) into the ferromagnetic material. Topological insulators may provide a significantly larger spin hall angle and charge/spin current conversion efficiency, relative to heavy metals with large spin-orbit coupling. This higher conversion efficiency is beneficial, for instance, for logic and memory devices that utilize spin-orbit torque to switch the magnetization of a ferromagnetic material. Thus, using a ruthenium diffusion barrier as variously provided herein enables integration of topological insulators into ferromagnetic stacks using a relatively simple annealing process in a chalcogen environment.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some example embodiments, such tools may indicate the presence of a thin ruthenium film (e.g., 0.5 nm<d<5 nm) between a topological insulator material (e.g., $(Bi,Sb)_2X_3$) and a ferromagnet, as variously described herein. Numerous configurations and variations will be apparent in light of this disclosure.

Magnetic Memory Cell Architecture

Figure 1:
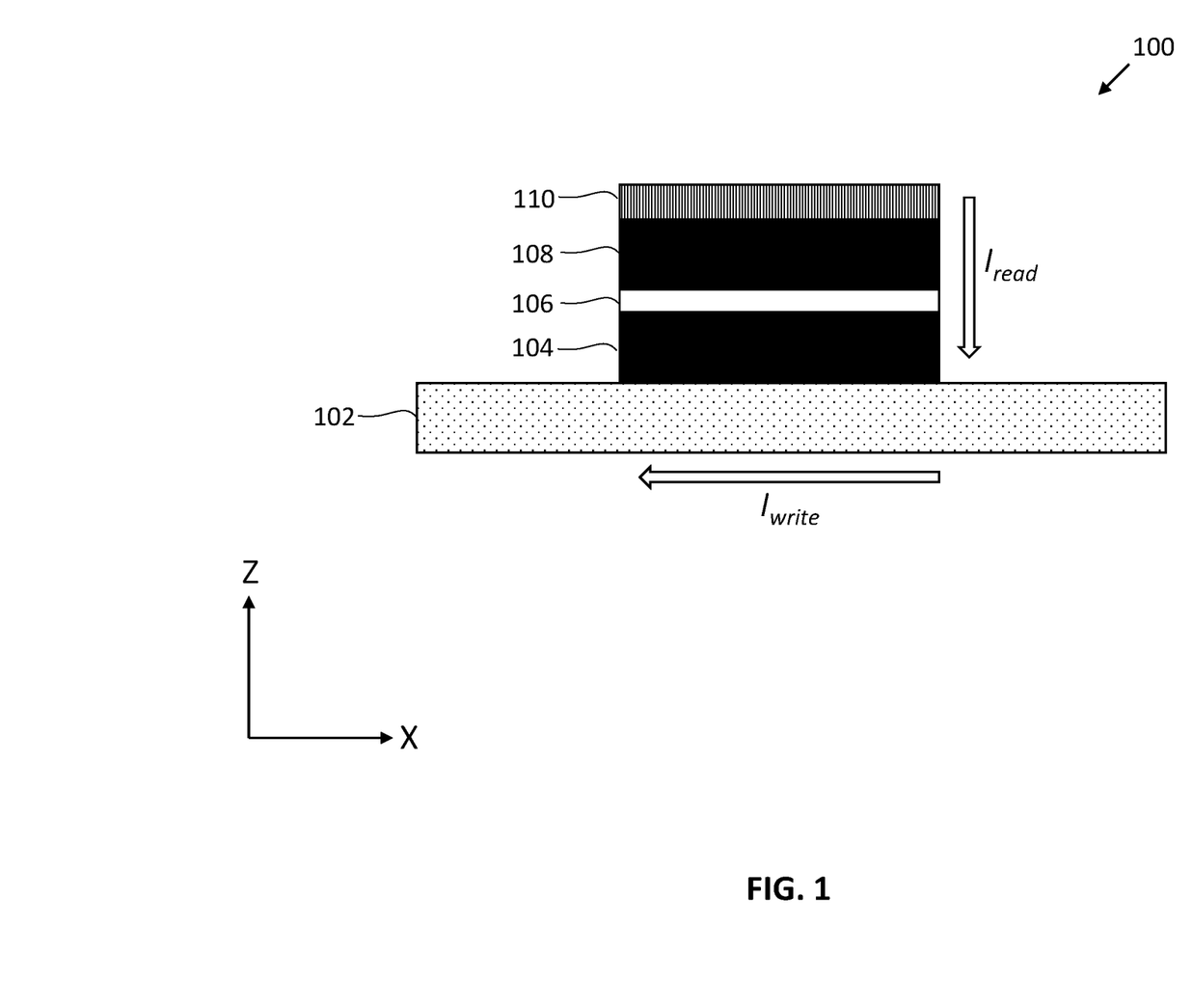
FIG. 1 illustrates a cross-section view of a portion of a magnetic random-access memory (MRAM) cell.

FIG. 1 illustrates an example MRAM cell 100 having a base conductive layer 102 and a magnetic tunnel junction (MTJ) stack, which in this example case includes a free ferromagnetic layer 104, a fixed ferromagnetic layer 108, and an insulating layer 106 between the free and fixed ferromagnetic layers 104 and 108. MRAM cell 100 may also include a capping conductive layer 110. As the names imply, fixed ferromagnetic layer 108 includes a fixed magnetic polarity (e.g., a permanent magnet) while free ferromagnetic layer 104 can have its magnetic polarity changed. More generally, an MTJ device configuration includes an insulating layer of tunneling oxide sandwiched between two ferromagnetic layers respectively referred to as the fixed and free layers. The direction of the magnetic field in the free layer determines whether the MTJ device is in the high resistivity state or in the low resistivity state. A binary zero can be stored in the MTJ device by changing its resistance to the low resistivity state, and a binary one can be stored by changing its resistance to the high resistivity state. Advantageously, no static power is required to maintain the resistance state once set. If the insulating layer 106 is sufficiently thin, electrons may pass from one ferromagnetic layer to the other via quantum tunneling through the insulating layer 106.

The two ferromagnetic layers of a given MTJ exhibit magnetic anisotropy—a directional dependence of their magnetic properties. The magnetic anisotropy of a given ferromagnetic layer may result from various sources including, but not limited to: bulk-based anisotropy (e.g., magnetocrystalline anisotropy; shape anisotropy); and/or interface-based anisotropy. Depending upon the direction of magnetization of its constituent ferromagnetic layers, a given MTJ may be classified as exhibiting either: in-plane magnetic anisotropy; or out-of-plane magnetic anisotropy. An in-plane MTJ is one in which the direction of magnetization is along the plane of the two ferromagnetic layers. Conversely, an out-of-plane (perpendicular) MTJ is one in which the direction of magnetization is orthogonal to the plane of the constituent ferromagnetic layers. In either case, the two ferromagnetic layers may be configured such that their respective magnetizations are aligned either in the same direction—the parallel (P) state—or in opposing directions—the anti-parallel (AP) state.

The free and fixed ferromagnetic layers 104 and 108 may be implemented, for example, as conventionally done and may include, for instance, iron, cobalt, nickel, alloys thereof, transition metal-metalloid alloys (e.g., transition metal with a metalloid such as boron), and/or any other suitable ferromagnetic materials. In some example embodiments, the free and fixed ferromagnetic layers 104 and 108 each may have a thickness, for example, in the monolayer or nanometer range (e.g., tens of angstroms, such as 1-100 nm). The insulating layer 106 may be, for example, any suitable dielectric or insulator material or materials (e.g., oxides, nitrides, etc.), and in some specific example embodiments is magnesium oxide, aluminum oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate, and/or other media/material which is non-magnetic and permits sufficient quantum tunneling. The dimensions (e.g., surface area; thickness) of the insulating layer 106 can be comparable to those of the ferromagnetic layers 104 and 108, and may be chosen or otherwise tuned such that the free and fixed ferromagnetic layers 104 and 108 are sufficiently insulated from one another while still permitting electrons to pass from one of such ferromagnetic layers to the other via quantum tunneling through the insulator. Numerous other suitable materials, geometries, and/or configurations for the MTJ stack will be apparent and the present disclosure is not intended to be limited to any particular material, geometry, and/or configuration.

MRAM cell 100 may be, for example, a spin-orbit torque (SOT) MRAM cell or a spin-transfer torque (STT) MRAM cell depending on how the read/write current is applied. To perform a write operation in a SOT-MRAM device, a current/write is applied across base conductor layer 102. The applied current causes a change to the magnetic polarity of free ferromagnetic layer 104 and sets the value of MRAM cell 100 to either a logic '0' or logic '1'. To perform a read operation in a SOT-MRAM device, a current $I_{read}$ is applied through the stack of layers that make up MRAM cell 100. The resistance through the stack will vary depending on whether free ferromagnetic layer 104 is polarized into either a logic '0' orientation or a logic '1' orientation. In the STT MRAM device, both the read and write currents are applied through the stack of layers that make up the MRAM cell 100.

Base conductor layer 102 includes a topological insulator compound having one or more chalcogen elements (such as selenium and/or tellurium) and one or more elements from Group 15 of the periodic table (such as bismuth or antimony or bismuth-antimony). As noted above, topological insulators may provide a significantly larger spin hall angle and charge/spin current conversion efficiency when compared to heavy metals with large spin-orbit coupling. This higher conversion efficiency can be beneficial for logic and memory devices that utilize spin-orbit torque to switch the magnetization of the free ferromagnetic layer. However, integration of topological insulators with ferromagnetic materials is challenging as the chalcogen elements of the topological insulators tend to diffuse into adjacent ferromagnetic layers.

Thus, and in accordance with some embodiments, a ruthenium layer is disposed between the topological insulator layer and the ferromagnetic layer to prevent diffusion of the chalcogen elements into the ferromagnetic layer during the fabrication process. In one example embodiment, a memory device includes an array of memory cells where each memory cell includes a first material layer having a ferromagnetic material, a second material layer having ruthenium, and a third material layer having bismuth and/or antimony. The second material layer is sandwiched between the first material layer and the third material in a stacked configuration suitable for a magnetic memory cell design.

As will be appreciated in light of this disclosure, the presence of the ruthenium layer effectively protects the ferromagnetic layers from unwanted diffusion of chalcogen elements used during the fabrication of the topological insulator layer. Numerous configurations and embodiments will be apparent in light of this disclosure.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 4" may be used to refer to the collection of drawings of FIGS. 4A-B, etc.

It should be readily understood that the meaning of "above" and "over" in the present disclosure should be interpreted in the broadest manner such that "above" and "over" not only mean "directly on" something but also include the meaning of over something with an intermediate feature or a layer therebetween. Additionally, the meaning of "on" in the present disclosure should be interpreted to mean directly on something (i.e., having no intermediate feature or layer therebetween.)

Further, spatially relative terms, such as "beneath," "below," "lower," "above," "upper," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer. A substrate can be a layer, can include one or more layers therein, and/or can have one or more layer thereupon, thereabove, and/or therebelow.

Further, materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants or impurities or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In addition, the stoichiometry of compounds provided herein may vary from one embodiment to the next, and such compounds represented without stoichiometric coefficients or values are intended to represent all forms of that compound.

Memory Device Embodiments

Figure 2:
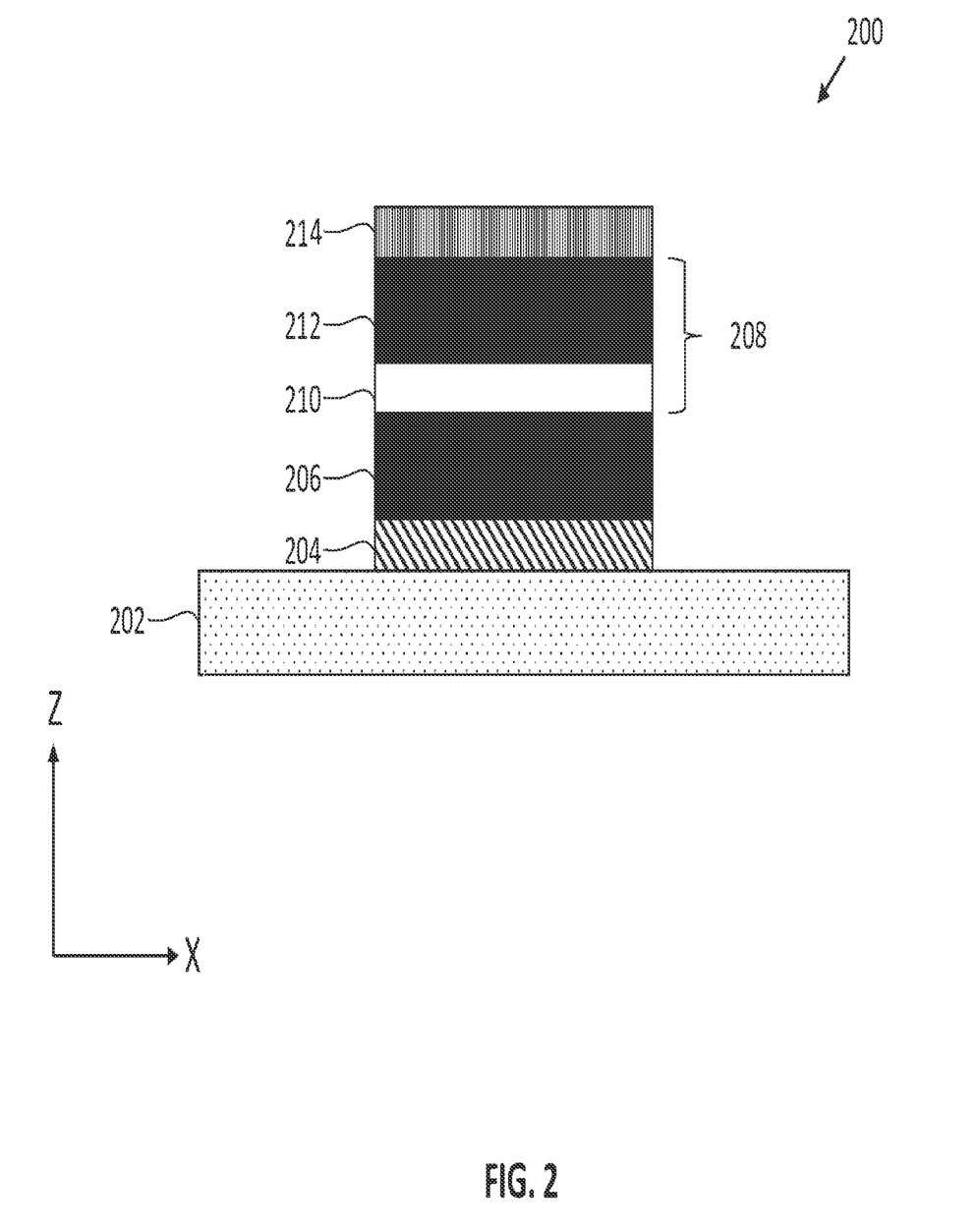
FIG. 2 illustrates a cross-section view of a portion of a first type of magnetic memory cell, in accordance with some embodiments of the present disclosure.

FIG. 2 illustrates an example MRAM cell 200, according to an embodiment. MRAM cell 200 includes a base material layer 202 with a stack of layers deposited over base material layer 202. As discussed above with reference to MRAM cell 100, base material layer 202 may be a topological insulator that comprises bismuth and/or antimony upon deposition of base material layer 202. At some point in time after deposition, base material layer 202 may be annealed in an environment containing at least one of selenium and/or tellurium (or other suitable chalcogen element or compound) to form the final topological insulator structure, according to an embodiment. Base material layer 202 may have a chemical structure of $X_2Z_3$, such as the case where X is bismuth and/or antimony and Z is selenium and/or tellurium. Specific examples include bismuth selenide, bismuth telluride, and antimony telluride.

According to some embodiments, a material layer 204 that comprises ruthenium is disposed over base material layer 202. Material layer 204 may be deposited using any known deposition technique such as chemical vapor deposition (CVD), atomic layer deposition (ALD), or physical vapor deposition (PVD). Material layer 204 may have a thickness between 0.5 nm and 5 nm (e.g., one to several monolayers, or thicker).

A first ferromagnetic layer 206 may be disposed over material layer 204. First ferromagnetic layer 206 may be a free magnetic layer meaning that its magnetic polarization can change in response to an externally applied field. In such embodiments, the fixed ferromagnetic layer is in the stack of layers 208 (to be discussed in turn). In other embodiments, first ferromagnetic layer 206 may be a fixed magnetic layer, and the free magnetic layer is in the stack of layers 208. In any such example embodiments, first ferromagnetic layer 206 includes a suitable ferromagnetic material, such as Fe (iron), Co (cobalt), Ni (nickel), CoFeB (cobalt, iron, and boron), NiFe (nickel and iron), Fe—Ni—Co (iron, nickel, and cobalt), or CoFe (cobalt and iron).

A stack of layers 208 is disposed over first ferromagnetic layer 206. Stack of layers 208 may include an insulating layer 210 and a second ferromagnetic layer 212. In some examples, stack of layers 208 also includes any number of other conductive or insulating layers that help to facilitate the flow of current through each of the layers of MRAM cell 200 and to facilitate the separate magnetic domains created by first ferromagnetic layer 206 and second ferromagnetic layer 212. In some embodiments, stack of layers 208 may include any number of compositionally different or distinct material layers, but at least includes insulating layer 210 and second ferromagnetic layer 212. In some such example embodiments, second ferromagnetic layer 212 includes CoFeB, NiFe, CoFe, or other suitable ferromagnetic material. A capping conductive layer 216 may be disposed over stack of layers 208.

Insulating layer 210 may be very thin (e.g., one to several monolayers) such that electrons can tunnel through the thickness of insulating layer 210. In some embodiments, insulating layer 210 comprises magnesium oxide (MgO) or other suitable insulating material such as those previously mentioned. Second ferromagnetic layer 212 may be a fixed magnetic layer meaning that its magnetic polarization has been permanently fixed in a given direction. In such embodiments, the free ferromagnetic layer is first ferromagnetic layer 206. In other embodiments, second ferromagnetic layer 212 is a free magnetic layer, and the fixed magnetic layer is first ferromagnetic layer 206. In any such example embodiments, second ferromagnetic layer 212 includes a suitable ferromagnetic material, such as CoFeB, NiFe, CoFe, or other suitable ferromagnetic material.

Following deposition of each of the material layers over base material layer 202, an etching process through the thickness of the material layers down to base material layer 202 may be performing using standard dry etching techniques (e.g., reaction ion etching). Once exposed, base material layer 202 is annealed in an environment containing a chalcogen element (e.g., selenium or tellurium or both) to form base material layer 202 into a topological insulator. During the annealing process, material layer 204 blocks the chalcogen elements from diffusing into first ferromagnetic layer 206, or into any other layer of stack of layers 208.

Like MRAM cell 100, MRAM cell 200 may be an example of a SOT-MRAM cell or a STT-MRAM cell depending on how current is applied through the device. In the example of an SOT-MRAM cell, current is applied through base material layer 202 in order to write a logic '0' or logic '1'. Base material layer 202 converts the input current into a spin-polarized current through the Spin Hall Effect (SHE). This generates a spin orbit torque to switch the magnetization of first ferromagnetic layer 206. To read from MRAM cell 200, current is applied through the entire layer stack from capping conductive layer 214 to base material layer 202.

Figure 4A:
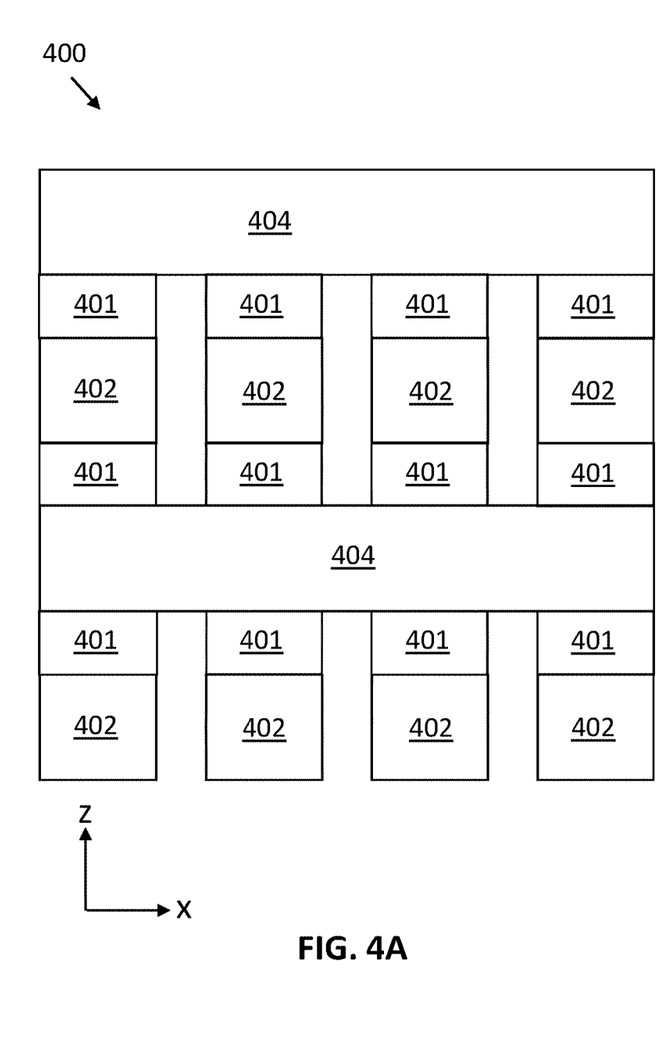
FIGS. 4A and 4B illustrate orthogonal cross-section views of a stacked array of memory cells, in accordance with some embodiments of the present disclosure.
Figure 4B:
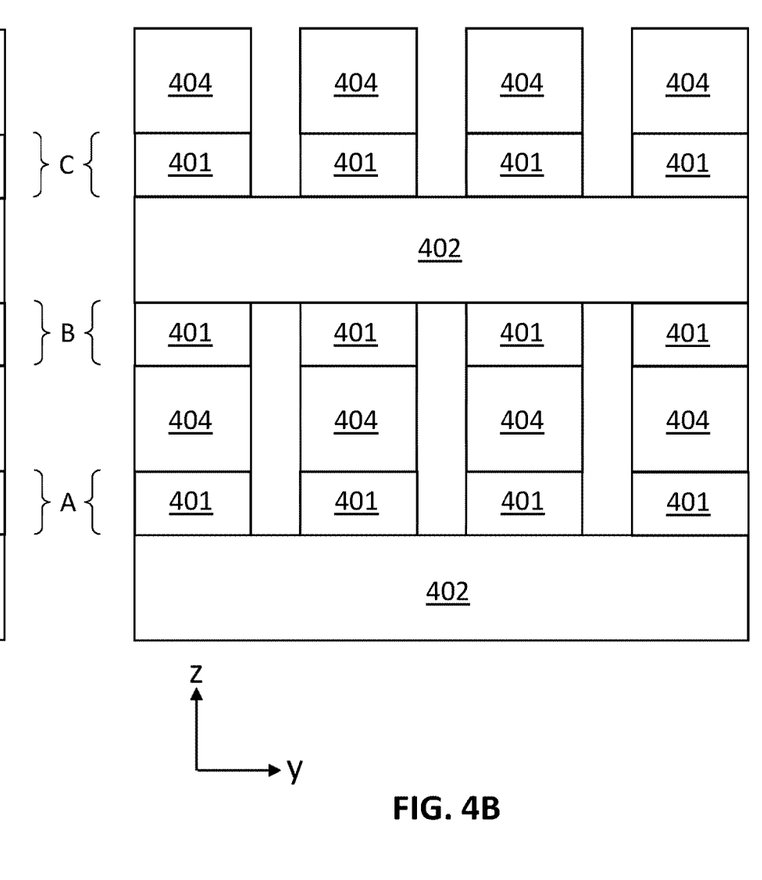

Although not illustrated in FIG. 2, base material layer 202 may be disposed over a substrate or over an insulating layer on a substrate. Furthermore, as will be discussed in more detail with reference to FIG. 4, MRAM cell 200 may be patterned in a memory array made up of any number of addressable MRAM cells.

Figure 3:
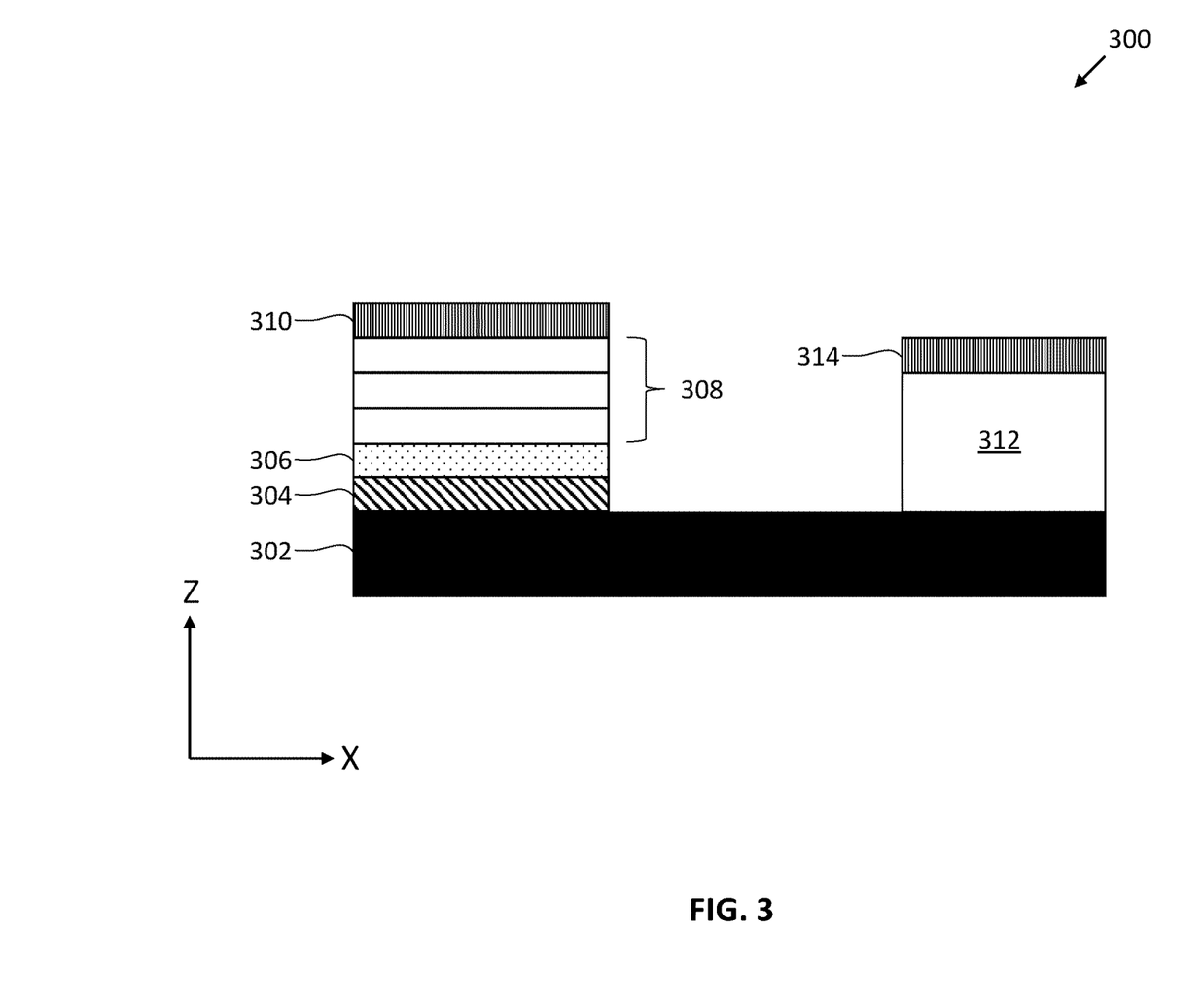
FIG. 3 illustrates a cross-section view of a portion of a second type of magnetic memory cell, in accordance with some embodiments of the present disclosure.

FIG. 3 illustrates an example of a different type of memory cell, sometimes referred to as a magnetoelectronic spin-orbit (MESO) memory cell 300, according to an embodiment. MESO memory cell 300 includes a base ferromagnetic layer 302. Base ferromagnetic layer 302 is a free magnetic layer and thus can change its magnetic polarity in response to an externally applied field. In other example embodiments, base ferromagnetic layer 302 can be a fixed magnetic layer, as will be appreciated. In some examples, base ferromagnetic layer 302 includes CoFeB, NiFe, CoFe, or other suitable ferromagnetic material. A material layer 304 comprising ruthenium is disposed over base ferromagnetic layer 302. Material layer 304 may be deposited using any known deposition technique such as chemical vapor deposition (CVD), atomic layer deposition (ALD), or physical vapor deposition (PVD). Material layer 304 may have a thickness between 0.5 nm and 5 nm (e.g., one to several monolayers, or thicker).

A second material layer 306 is disposed over material layer 304. Second material layer 306 may be a topological insulator that comprises bismuth and/or antimony upon deposition of second material layer 306. Following the deposition of second material layer 306, an annealing process is performed in an environment containing selenium and/or tellurium to form the final topological insulator structure. Second material layer 306 may have a chemical structure of $X_2Z_3$, where X is bismuth and/or antimony and Z is selenium and/or tellurium. During the annealing process, material layer 304 blocks the chalcogen elements from diffusing into base ferromagnetic layer 302.

A stack of layers 308 may be disposed over second material layer 306. Stack of layers 308 can include any number of conductive layers for forming a better ohmic contact with second material layer 306. In some embodiments, stack of layers 308 is omitted from MESO memory cell 300. A capping conductive layer 310 may be disposed over stack of layers 308, or directly over second material layer 306 in the absence of stack of layers 308.

MESO memory cell 300 also includes a magnetoelectric module 312 disposed on base ferromagnetic layer 302. Magnetoelectric module 312 is designed to control the magnetization of ferromagnetic layer 302, which then determines the direction of the output charge current through second material layer 306. Magnetoelectric module 312 includes a top electrode 314 to act as a drive terminal for applying current through base ferromagnetic layer 302. Accordingly, a 'write' current flows through magnetoelectric module 312 and base ferromagnetic layer 302 to set the magnetic polarity to either a logic '0' or logic '1'. A 'read' current flows between capping conductive layer 310 and base ferromagnetic layer 302, where second material layer 306 is used to convert between a spin-polarized current from base ferromagnetic layer 302 to the output 'read' current through the inverse Spin Hall Effect (ISHE).

Although not illustrated in FIG. 3, base ferromagnetic layer 302 may be disposed over a substrate or over an insulating layer on a substrate. Furthermore, as will be discussed in more detail with reference to FIG. 4, MESO memory cell 300 may be patterned in a memory array made up of any number of addressable memory cells.

Memory Array Architecture

FIGS. 4A and 4B illustrate cross-section views of a portion of a memory array 400, according to an embodiment. Memory array 400 includes adjacent memory cells 401, each addressable by a particular word line 402 and bit line 404, according to some embodiments. Memory cells 401 may represent either MRAM cell 200 or MESO memory cell 300. In some embodiments, bit line 404 represents two separate bit lines that form a read bit line and a write bit line. In examples where memory cells 401 represent MRAM cells 200, word line 402 is coupled to the gate of an access transistor that controls the flow of current to a particular memory cell 401, while the read bit line is coupled to capping conductive layer 216 and the write bit line is coupled to base material layer 202. In examples where memory cells 401 represent MESO memory cells 300, word line 402 is coupled to the gate of an access transistor that controls the flow of current to a particular memory cell 401, while the read bit line is coupled to capping conductive layer 310 and the write bit line is coupled to electrode 314. In some embodiments, word lines 402 run orthogonal to bit lines 404 and memory array 400 alternates between word lines 402 and bit lines 404 in the Z-direction. With reference to FIGS. 4A and 4B, word lines 402 run along the Y-direction (into and out of the page in FIG. 4A), and bit lines 404 run along the X-direction (into and out of the page in FIG. 4B). Word lines 402 and bit lines 404 may be made of any conductive material, such as a metal, metal alloy, or polysilicon. In some examples, word lines 402 and bit lines 404 are made of tungsten, silver, aluminum, gold, carbon, or copper, or a multi-layer structure comprising such materials (e.g., tungsten and carbon layers).

The cross-section views in FIGS. 4A and 4B are taken orthogonally to one another in memory array 400. Memory array 400 includes a plurality of memory cells 401 arranged in arrays A, B, and C stacked in the Z-direction to form a 3D memory structure. The array includes an ordered arrangement of rows and columns of memory cells 401 in the XY plane as illustrated in FIGS. 4A and 4B. Other ordered arrangements are possible as well.

It will be appreciated that the number of memory cells 401 illustrated is purely used as an example, and that any number of memory cells 401 can be used in each tier, and that any number of tiers in the Z-direction can be used as well. According to some embodiments, the height in the Z-direction of a given memory cell 401 is between about 30 nm and about 50 nm. According to some embodiments, the width in either the X-direction or the Y-direction of a given memory cell 401 is between about 30 nm and about 50 nm. The width may be the same in both the X-direction and the Y-direction. In some embodiments, the width of a given memory cell is different between the X-direction and the Y-direction. Any number of memory cell geometries can be utilized, as will be appreciated.

Figure 5:
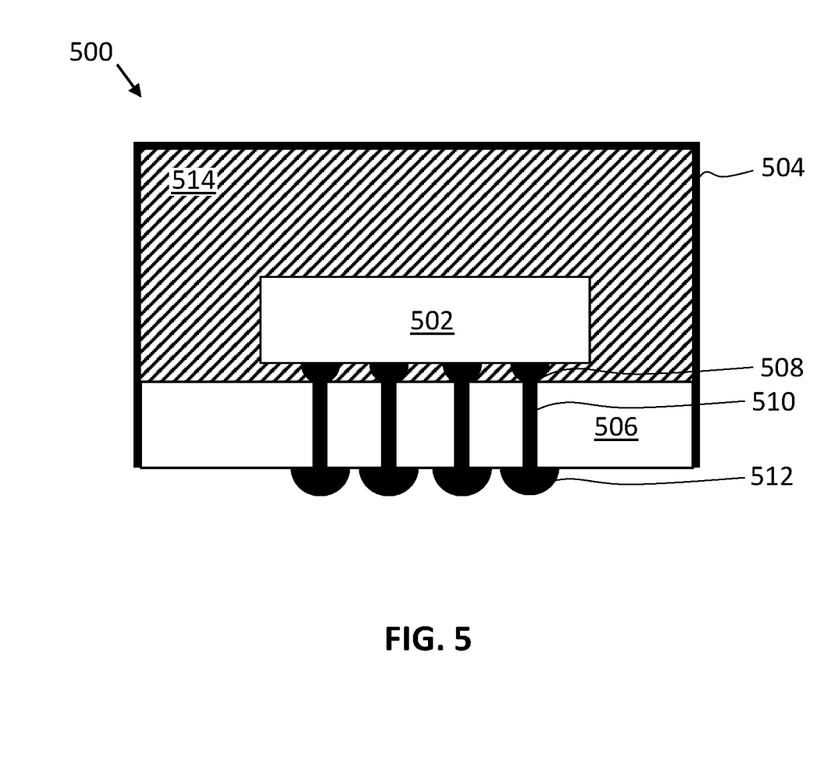
FIG. 5 illustrates a cross-section view of a chip package containing one or more memory dies, in accordance with some embodiments of the present disclosure.

FIG. 5 illustrates an example embodiment of a chip package 500. As can be seen, chip package 500 includes one or more dies 502. Chip package 500 may be a memory device when one or more dies 502 include one or more memory dies, whether it be a dedicated memory die, or some other die that has a memory portion juxtaposed to other functional circuitry of the die (e.g., such as a processor that has on-board memory). One or more dies 502 may include any number of memory arrays 400 as well as any other circuitry used to interface with the memory arrays, in some example configurations. In still other embodiments, memory arrays 400 may be present on one or more dies 502 and other circuitry used to interface (e.g., cell selection circuitry, readout circuitry, and programming circuitry) with one or more dies 502 is on another die within chip package 500.

As can be further seen, chip package 500 includes a housing 504 that is bonded to a package substrate 506. The housing 504 may be any standard or proprietary housing, and provides, for example, electromagnetic shielding and environmental protection for the components of chip package 500. The one or more dies 502 may be conductively coupled to a package substrate 506 using connections 508, which may be implemented with any number of standard or proprietary connection mechanisms, such as solder bumps, ball grid array (BGA), pins, or wire bonds, to name a few examples. Package substrate 506 may be any standard or proprietary package substrate, but in some cases includes a dielectric material having conductive pathways (e.g., including conductive vias and lines) extending through the dielectric material between the faces of package substrate 506, or between different locations on each face. In some embodiments, package substrate 506 may have a thickness less than 1 millimeter (e.g., between 0.1 millimeters and 0.5 millimeters), although any number of package geometries can be used. Additional conductive contacts 512 may be disposed at an opposite face of package substrate 506 for conductively contacting, for instance, a printed circuit board. One or more vias 510 extend through a thickness of package substrate 506 to provide conductive pathways between one or more of connections 508 to one or more of contacts 512. Vias 510 are illustrated as single straight columns through package substrate 506 for ease of illustration, although other configurations can be used (e.g., damascene, dual damascene, through-silicon via). In still other embodiments, vias 510 are fabricated by multiple smaller stacked vias, or are staggered at different locations across package substrate 506. In the illustrated embodiment, contacts 512 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 512, to inhibit shorting.

In some embodiments, a mold material 514 may be disposed around the one or more dies 502 included within housing 504 (e.g., between one or more dies 502 and package substrate 506 as an underfill material, as well as between one or more dies 502 and housing 504 as an overfill material). Although the dimensions and qualities of the mold material 514 can vary from one embodiment to the next, in some embodiments, a thickness of mold material 514 is less than 1 millimeter. Example materials that may be used for mold material 514 include epoxy mold materials, as suitable. In some cases, the mold material 514 is thermally conductive, in addition to being electrically insulating.

Fabrication Methods

Figure 6:
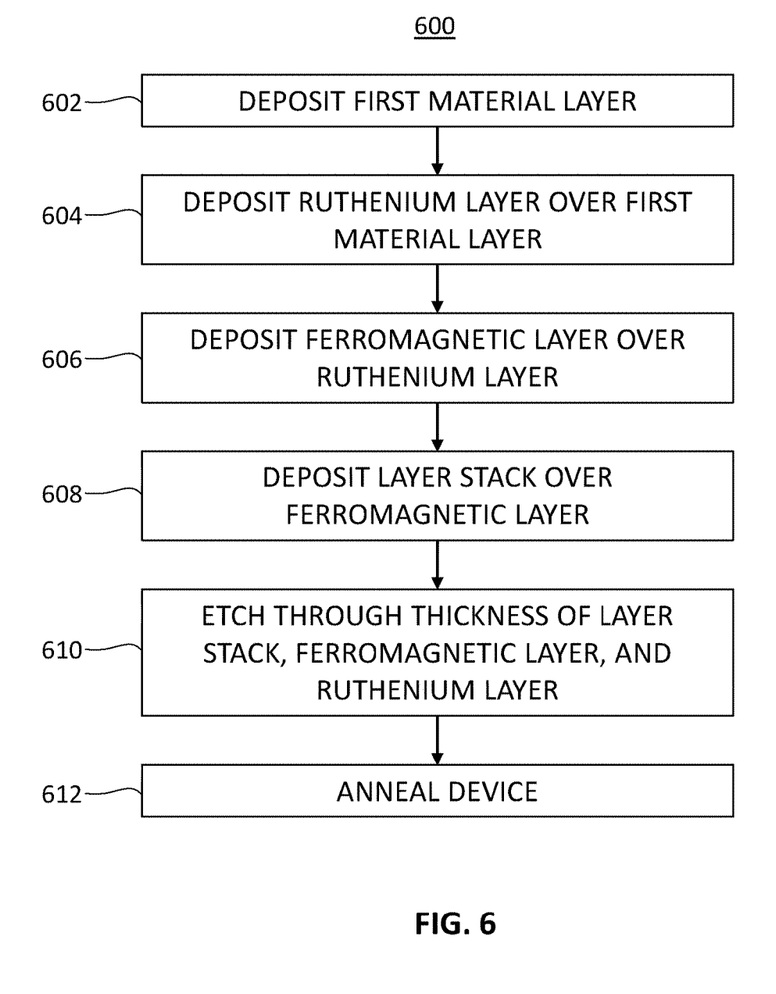
FIG. 6 is a flowchart of a fabrication process for the first type of magnetic memory cell, in accordance with an embodiment of the present disclosure.

FIG. 6 is a flow chart of a method 600 for fabricating a memory device having any number of memory cells, such as MRAM cell 200. The operations of method 600 may be performed to fabricate a first tier of MRAM cells 200, and the operations may be repeated to form any number of other tiers of MRAM cells 200 to form a three-dimensional memory device. Any other lithographic or standard etching operations may be performed before, between, or after any illustrated operations of method 600 and have been omitted merely to focus on the operations most related to the specific memory structures of MRAM cells 200. The correlation of the various operations of method 600 to the specific components illustrated in FIG. 2 is not intended to imply any structural and/or use limitations.

Method 600 begins at operation 602 where a first material layer is deposited. The first material layer may be deposited on a substrate, or on any number of insulating layers above a substrate. According to some embodiments, the first material layer comprises a Group 15 element or compound such as bismuth and/or antimony.

Method 600 proceeds with operation 604 where a second material layer comprising ruthenium is deposited over the first material layer. The second material layer may comprise pure ruthenium, or have at least 50% ruthenium, at least 60% ruthenium, at least 70% ruthenium, at least 80% ruthenium, or at least 90% ruthenium. The second material layer may have a thickness between about 1 nm and about 5 nm (e.g., one to several monolayers, or thicker). The second material layer may be deposited in situ with the first material layer. Either of the first material layer and second material layer may be deposited using any known standard deposition technique, such as CVD, ALD, or PVD.

Method 600 continues with operation 606 where a first ferromagnetic layer is deposited over the second material layer. The first ferromagnetic layer may include CoFeB, NiFe, or CoFe. In some embodiments, the first ferromagnetic layer includes a free ferromagnetic material having a magnetic polarization that is adaptable based on an externally applied magnetic field. In some embodiments, the first ferromagnetic layer is deposited in situ with the first and second material layers.

Method 600 continues with operation 608 where a layer stack is deposited over the first ferromagnetic layer. The layer stack can include any number of deposited conductive or insulating layers to serve various purposes. For example, the conductive layers may provide enhanced ohmic contact between other layers of the memory cell while the insulating layers may electrically separate certain materials in the overall layer stack. In an embodiment, the stack of layers includes at least a second ferromagnetic layer and an insulating layer disposed between the first ferromagnetic layer and the second ferromagnetic layer. The second ferromagnetic layer may include CoFeB, NiFe, or CoFe. In some embodiments, the second ferromagnetic layer includes a fixed ferromagnetic material having a fixed magnetic polarization (e.g., a permanent magnet). The insulating layer may be provided between the ferromagnetic layers and be thin enough to allow for electrons to tunnel through the thickness of the insulating layer.

Method 600 continues with operation 610 where an etch process is performed through a thickness of a portion of the layer stack, a portion of the first ferromagnetic layer, and a portion of the second material layer to form individual memory cells, such as MRAM cell 200. According to an embodiment, the etch does not extend through a thickness of the first material layer. The etch may be a dry etch process using reactive ion etching, and patterned photoresist may be used to mask a portion of the MRAM cell to remain after the etching process. The etch process may be performed as a single etch through each of the layers, or as multiple etches using different chamber conditions to each through compositionally different or distinct material layers. Following the etching process, the first ferromagnetic layer and the second material layer may have the same cross-sectional area from a top-down perspective.

Method 600 continues with operation 612 where the memory device is annealed at a temperature between about 50° C. and 400° C. The annealing process is performed in a chamber that also includes a chalcogen element or compound, such as selenium and/or tellurium, in order to convert the first material layer into a topological insulator such as bismuth selenide (BiSe), antimony telluride (SbTe), bismuth tellurium selenide (BiTeSe), bismuth antimony telluride (BiSbTe), or any other material that acts as a suitable topological insulator. The presence of the second material layer having the ruthenium acts as a diffusion barrier between the first material layer and the first ferromagnetic layer. Accordingly, the second material layer protects the first ferromagnetic layer from contamination caused by diffusing chalcogen elements and allows for the integration of topological insulating materials and ferromagnetic materials in the same memory cell.

Figure 7:
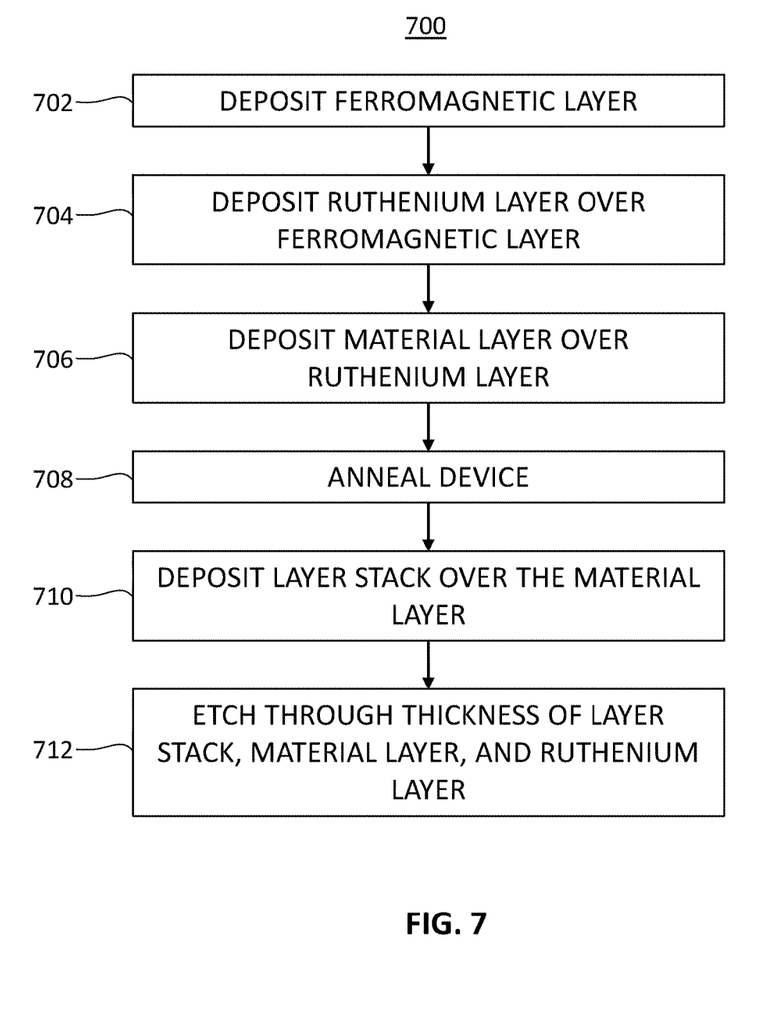
FIG. 7 is a flowchart of a fabrication process for the second type of magnetic memory cell, in accordance with an embodiment of the present disclosure.

FIG. 7 is a flow chart of a method 700 for fabricating a memory device having any number of memory cells, such as MESO memory cell 300. The operations of method 700 may be performed to fabricate a first tier of MESO memory cells 300, and the operations may be repeated to form any number of other tiers of MESO memory cells 300 to form a three-dimensional memory device. Any other lithographic or standard etching operations may be performed before, between, or after any illustrated operations of method 700 and have been omitted merely to focus on the operations most related to the specific memory structures of MESO memory cells 300. The correlation of the various operations of method 700 to the specific components illustrated in FIG. 3 is not intended to imply any structural and/or use limitations.

Method 700 begins at operation 702 where a ferromagnetic layer is deposited. The ferromagnetic layer may be deposited on a substrate, or on any number of insulating layers above a substrate. The ferromagnetic layer may include CoFeB, NiFe, or CoFe. In some embodiments, the ferromagnetic layer includes a free ferromagnetic material having a magnetic polarization that is adaptable based on an externally applied magnetic field.

Method 700 continues with operation 704 where a first material layer comprising ruthenium is deposited over the ferromagnetic layer. The first material layer may comprise pure ruthenium, or have at least 50% ruthenium, at least 60% ruthenium, at least 70% ruthenium, at least 80% ruthenium, or at least 90% ruthenium. The first material layer may have a thickness, for example, between about 0.5 nm and about 5 nm (e.g., one to several monolayers, or thicker). The first material layer may be deposited in situ with the ferromagnetic layer. The first material layer may be deposited using any known standard deposition technique, such as CVD, ALD, or PVD.

Method 700 continues with operation 706 where a second material layer is deposited over the first material layer. According to some embodiments, the second material layer comprises a Group 15 element or compound such as bismuth and/or antimony.

Method 700 continues with operation 708 where the memory device is annealed at a temperature between about 50° C. and 400° C. The annealing process is performed in a chamber that also includes a chalcogen element or compound, such as selenium and/or tellurium, in order to convert the second material layer into a topological insulator such as bismuth selenide (BiSe), antimony telluride (SbTe), or any other material that acts as a suitable topological insulator. The presence of the first material layer having the ruthenium acts as a diffusion barrier between the second material layer and the ferromagnetic layer. Accordingly, the first material layer protects the ferromagnetic layer from contamination caused by diffusing chalcogen elements and allows for the integration of topological insulating materials and ferromagnetic materials in the same memory cell.

Method 700 continues with operation 710 where a layer stack is deposited over the second material layer. The layer stack can include any number of deposited conductive or insulating layers to serve various purposes. For example, the conductive layers may provide enhanced ohmic contact between other layers of the memory cell while the insulating layers may electrically separate certain materials in the overall layer stack. In some embodiments, the layer stack includes only one or more conductive layers that serve as a top electrode contact for the memory cell.

Method 700 continues with operation 712 where an etch process is performed through a thickness of a portion of the layer stack, a portion of the second material layer, and a portion of the first material layer to form individual memory cells, such as MESO memory cell 300. According to an embodiment, the etch does not extend through a thickness of the ferromagnetic layer. The etch may be a dry etch process using reactive ion etching, and patterned photoresist may be used to mask a portion of the MESO memory cell to remain after the etching process. The etch process may be performed as a single etch through each of the layers, or as multiple etches using different chamber conditions to each through different material layers. Following the etching process, the first material layer and the second material layer may have the same cross-sectional area from a top-down perspective.

Although not explicitly illustrated, method 700 may also include the deposition and patterning of a magnetoelectric module on the ferromagnetic layer, and a conductive layer over the magnetoelectric module to act as a top electrode of the magnetoelectric module. The magnetoelectric module may be used to control the magnetization of the ferromagnetic layer (effectively writing a '0' or '1' to the memory cell) via a current applied to the top electrode.

Example Electronic Device

Figure 8:
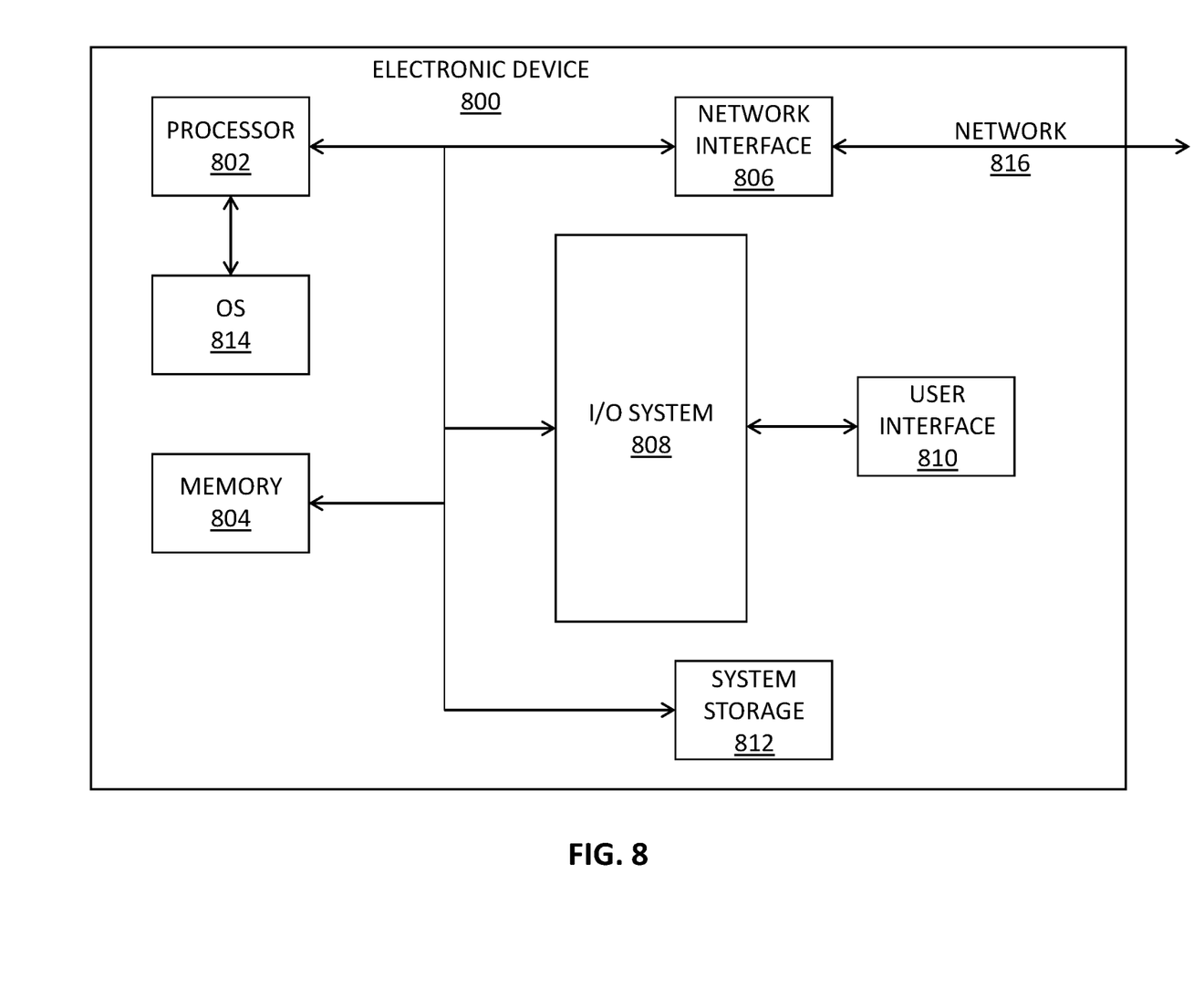
FIG. 8 illustrates an example electronic device that can include one or more of the memory cell embodiments of the present disclosure.

FIG. 8 illustrates an example electronic device 800 that may include one or more memory devices such as the embodiments disclosed herein. In some embodiments, electronic device 800 may host, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, imaging device, wearable device, embedded system, and so forth. Any combination of different devices may be used in certain embodiments.

In some embodiments, electronic device 800 may comprise any combination of a processor 802, a memory 804, a network interface 806, an input/output (I/O) system 808, a user interface 810, and a storage system 812. As can be further seen, a bus and/or interconnect is also provided to allow for communication between the various components listed above and/or other components not shown. Electronic device 800 can be coupled to a network 816 through network interface 806 to allow for communications with other computing devices, platforms, or resources. Other componentry and functionality not reflected in the block diagram of FIG. 8 will be apparent in light of this disclosure, and it will be appreciated that other embodiments are not limited to any particular hardware configuration.

Processor 802 can be any suitable processor and may include one or more coprocessors or controllers to assist in control and processing operations associated with electronic device 800. In some embodiments, processor 802 may be implemented as any number of processor cores. The processor (or processor cores) may be any type of processor, such as, for example, a micro-processor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core.

Memory 804 can be implemented using any suitable type of digital storage including, for example, flash memory and/or random access memory (RAM). In some embodiments, memory 804 may include various layers of memory hierarchy and/or memory caches. Memory 804 may be implemented as a volatile memory device such as, but not limited to, a RAM, dynamic RAM (DRAM), or static RAM (SRAM) device. Storage system 812 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage system 812 may comprise technology to increase the storage performance enhanced protection for valuable digital media when multiple hard drives are included. According to some embodiments of the present disclosure, either or both memory 804 and storage system 812 includes one or more memory arrays 400 having MRAM cells 200 or MESO memory cells 300 fabricated using the processes discussed herein. According to some embodiments of the present disclosure, either or both memory 804 and storage system 812 may be incorporated in a chip package 500 and bonded to a printed circuit board (PCB) along with one or more other devices.

Processor 802 may be configured to execute an Operating System (OS) 814 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS).

Network interface 806 can be any appropriate network chip or chipset which allows for wired and/or wireless connection between other components of electronic device 800 and/or network 816, thereby enabling electronic device 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 808 may be configured to interface between various I/O devices and other components of electronic device 800. I/O devices may include, but not be limited to, a user interface 810. User interface 810 may include devices (not shown) such as a display element, touchpad, keyboard, mouse, and speaker, etc. I/O system 808 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 802 or any chipset of electronic device 800.

It will be appreciated that in some embodiments, the various components of the electronic device 800 may be combined or integrated in a system-on-a-chip (SoC) architecture. In some embodiments, the components may be hardware components, firmware components, software components or any suitable combination of hardware, firmware or software.

In various embodiments, electronic device 800 may be implemented as a wireless system, a wired system, or a combination of both. When implemented as a wireless system, electronic device 800 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, electronic device 800 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

Numerous specific details have been set forth herein to provide a thorough understanding of the embodiments. It will be understood in light of this disclosure, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is an integrated circuit device comprising an array of memory cells where at least one of the memory cells comprises a first material layer comprising a ferromagnetic material; a second material layer comprising ruthenium; and a third material layer comprising bismuth, or antimony, or both bismuth and antimony. The second material layer is sandwiched between the first material layer and the third material layer in a stacked configuration.

Example 2 includes the subject matter of Example 1, wherein the third material layer further comprises selenium.

Example 3 includes the subject matter of Example 1 or 2, wherein the third material layer further comprises tellurium.

Example 4 includes the subject matter of any one of Examples 1-3, wherein the third material layer further comprises selenium and tellurium.

Example 5 includes the subject matter of Example 1, wherein the third material layer consists essentially of $(Bi_1,Sb_x)_2(Se_{1-y},Te_y)_3$, wherein X equals 0 to 1, Y equals 0 to 1, Bi equals bismuth, Sb equals antimony, Se equals selenium, and Te equals tellurium.

Example 6 includes the subject matter of Example 1, wherein the third material layer comprises $(Bi_1,Sb_x)_2(Se_{1-y},Te_y)_3$, wherein X equals 0 to 1, Y equals 0 to 1, Bi equals bismuth, Sb equals antimony, Se equals selenium, and Te equals tellurium.

Example 7 includes the subject matter of Example 1, wherein the third material layer is $(Bi_1,Sb_x)_2(Se_{1-y},Te_y)_3$, wherein X equals 0 to 1, Y equals 0 to 1, Bi equals bismuth, Sb equals antimony, Se equals selenium, and Te equals tellurium.

Example 8 includes the subject matter of any one of Examples 1-7, wherein the ferromagnetic material comprises iron and one or more of nickel, cobalt, and boron.

Example 9 includes the subject matter of any one of Examples 1-8, wherein the second material layer has a thickness that extends from the first material layer to the third material, the thickness in the range of 0.5 nm<d<5 nm.

Example 10 includes the subject matter of any one of Examples 1-9, further comprising a magnetoelectric layer on the first material layer.

Example 11 includes the subject matter of Example 10, wherein the array of memory cells is part of a magnetoelectric spin orbit (MESO) memory structure.

Example 12 includes the subject matter of any one of Examples 1-9, wherein the first material layer is part of a magnetic tunnel junction (MTJ) stack that is above the second material layer.

Example 13 includes the subject matter of Example 12, wherein the array of memory cells is part of a spin-orbit torque magnetic random-access memory (SOT MRAM) memory structure.

Example 14 includes the subject matter of Example 12, wherein the array of memory cells is part of a spin-transfer torque magnetic random-access memory (STT MRAM) memory structure.

Example 15 includes the subject matter of any one of Examples 1-14, wherein: the ferromagnetic material comprises iron and one or more of nickel, cobalt, and boron; the second material layer has a thickness between the first and third material layers in the range of 0.5 nm to 5 nm; and the third material layer comprises $(Bi_1,Sb_x)_2(Se_{1-y},Te_y)_3$, wherein X equals 0 to 1, Y equals 0 to 1, Bi equals bismuth, Sb equals antimony, Se equals selenium, and Te equals tellurium.

Example 16 includes the subject matter of any one of Examples 1-15, wherein the first material layer and the second material layer have a same cross-sectional area from a top-down perspective.

Example 17 is a memory device comprising the integrated circuit device of any one of Examples 1-16 1.

Example 18 is a processor comprising the memory device of Example 17.

Example 19 is a processor comprising the integrated circuit device of any one of Examples 1-16.

Example 20 is an electronic device, comprising a chip package comprising one or more memory dies, at least one of the one or more memory dies comprising a first material layer comprising a ferromagnetic material; a second material layer comprising ruthenium; and a third material layer comprising bismuth or antimony or both bismuth and antimony. The second material layer is sandwiched between the first material layer and the third material layer in a stacked configuration.

Example 21 includes the subject matter of Example 20, wherein the third material layer further comprises selenium or tellurium or both selenium and tellurium.

Example 22 includes the subject matter of Example 20 or 21, wherein the ferromagnetic material comprises iron and either nickel or cobalt.

Example 23 includes the subject matter of any one of Examples 20-22, wherein the second material layer has a thickness between the first and third material layers in the range of 0.5 nm to 5 nm.

Example 24 includes the subject matter of any one of Examples 20-23, wherein the first material layer and the second material layer have a same cross-sectional area from a top-down perspective.

Example 25 includes the subject matter of any one of Examples 20-24, wherein at least one of the one or more memory dies further comprises a magnetoelectric layer on the first material layer.

Example 26 includes the subject matter of Example 25, wherein the at least one of the one or more memory dies is part of a magnetoelectric spin orbit (MESO) memory structure.

Example 27 includes the subject matter of any one of Examples 20-24, wherein the first material layer is part of a magnetic tunnel junction (MTJ) stack that is above the second material layer.

Example 28 includes the subject matter of Example 27, wherein the at least one of the one or more memory dies is part of a spin-orbit torque magnetic random-access memory (SOT MRAM) memory structure.

Example 29 includes the subject matter of Example 27, wherein the at least one of the one or more memory dies is part of a spin-transfer torque magnetic random-access memory (STT MRAM) memory structure.

Example 30 includes the subject matter of any one of Examples 20-29, wherein: the ferromagnetic material comprises iron and one or more of nickel, cobalt, and boron; the second material layer has a thickness between the first and third material layers in the range of 0.5 nm to 5 nm; and the third material layer comprises $(Bi_1 Sb_x)_2 (Se_{1-y} Te_y)_3$, wherein X equals 0 to 1, Y equals 0 to 1, Bi equals bismuth, Sb equals antimony, Se equals selenium, and Te equals tellurium.

Example 31 includes the subject matter of any one of Examples 20-29, wherein the third material layer comprises $(Bi_1 Sb_x)_2 (Se_{1-y} Te_y)_3$, wherein X equals 0 to 1, Y equals 0 to 1, Bi equals bismuth, Sb equals antimony, Se equals selenium, and Te equals tellurium.

Example 32 is a method for fabricating a memory device. The method includes depositing a first material layer over a substrate, the first material layer comprising bismuth and/or antimony; depositing a second material layer over the first material layer, the second material layer comprising ruthenium; depositing a third material layer over the second material layer, the third material layer comprising a ferromagnetic material; depositing a stack of layers over the third material layer; etching through a planar thickness of at least the second material layer, the third material layer, and the stack of layers; and annealing the memory device in a chamber that includes a chalcogen element.

Example 33 includes the subject matter of Example 32, wherein the chalcogen element is selenium and/or tellurium.

Example 34 includes the subject matter of Example 32 or 33, further comprising depositing a capping conductive layer over the stack of layers.

Example 35 includes the subject matter of any one of Examples 32-34, wherein the annealing converts the first material layer into a topologically insulating compound.

Example 36 includes the subject matter of any one of Examples 32-35, wherein depositing the second material layer comprises depositing the second material layer at a thickness between 0.5 nm and 5 nm.

Example 37 includes the subject matter of any one of Examples 32-36, wherein the ferromagnetic material comprises iron and either nickel or cobalt.

Example 38 is a method of fabricating a memory device. The method includes depositing a first material layer over a substrate, the first material layer comprising a ferromagnetic material; depositing a second material layer over the first material layer, the second material layer comprising ruthenium; depositing a third material layer over the second material layer, the third material layer comprising bismuth and/or antimony; annealing the memory device in a chamber that includes a chalcogen element; depositing a stack of layers over the third material layer; and etching through a planar thickness of at least the second material layer, the third material layer, and the stack of layers.

Example 39 includes the subject matter of Example 38, wherein the chalcogen element is selenium and/or tellurium.

Example 40 includes the subject matter of Example 38 or 39, further comprising depositing a capping conductive layer over the stack of layers.

Example 41 includes the subject matter of any one of Examples 38-40, wherein the annealing converts the third material layer into a topologically insulating compound.

Example 42 includes the subject matter of any one of Examples 38-41, wherein depositing the second material layer comprises depositing the second material layer at a thickness between 0.5 nm and 5 nm.

Example 43 includes the subject matter of any one of Examples 38-42, wherein the ferromagnetic material comprises iron and either nickel or cobalt.

Example 44 includes the subject matter of any one of Examples 38-43, wherein the annealing occurs before the etching.

What is claimed is:

1. An integrated circuit device, comprising:
    an array of memory cells, at least one of the memory cells comprising a first material layer comprising a ferromagnetic material;
    a second material layer comprising ruthenium; and
    a third material layer comprising bismuth, or antimony, or both bismuth and antimony, wherein the second material layer is sandwiched between the first material layer and the third material layer in a stacked configuration, wherein the third material layer is an insulator layer.

2. The integrated circuit device of claim 1, wherein the third material layer further comprises selenium.

3. The integrated circuit device of claim 1, wherein the third material layer further comprises tellurium.

4. The integrated circuit device of claim 1, wherein the third material layer comprises $(Bi_1 Sb_x)_2 (Se_1\text{-}yTe_y)_3$, wherein X equals 0 to 1, Y equals 0 to 1, Bi equals bismuth, Sb equals antimony, Se equals selenium, and Te equals tellurium.

5. The integrated circuit device of claim 1, wherein the ferromagnetic material comprises iron and one or more of nickel, cobalt, and boron.

6. The integrated circuit device of claim 1, further comprising a magnetoelectric layer on the first material layer.

7. The integrated circuit device of claim 1, wherein the first material layer is part of a magnetic tunnel junction (MTJ) stack that is above the second material layer.

8. The integrated circuit device of claim 1, wherein the first material layer and the second material layer have a same cross-sectional area from a top-down perspective.

9. A memory device comprising the integrated circuit device of claim 1.

10. A processor comprising the integrated circuit device of claim 1.

11. An electronic device, comprising:
    a chip package comprising one or more memory dies, at least one of the one or more memory dies comprising
    a first material layer comprising a ferromagnetic material;
    a second material layer comprising ruthenium; and
    a third material layer comprising bismuth or antimony or both bismuth and antimony, wherein the second material layer is sandwiched between the first material layer and the third material layer in a stacked configuration, wherein the third material layer is an insulator layer.

12. The electronic device of claim 11, wherein the third material layer further comprises selenium or tellurium or both selenium and tellurium.

13. The electronic device of claim 11, wherein the ferromagnetic material comprises iron and either nickel or cobalt.

14. The electronic device of claim 11, wherein the first material layer and the second material layer have a same cross-sectional area from a top-down perspective.

15. The electronic device of claim 11, wherein at least one of the one or more memory dies further comprises a magnetoelectric layer on the first material layer.

16. The electronic device of claim 11, wherein the first material layer is part of a magnetic tunnel junction (MTJ) stack that is above the second material layer.

17. The electronic device of claim 11, wherein the third material layer comprises $(Bi_1,Sb_x)_2(Se_1\text{-}yTe_y)_3$, wherein X equals 0 to 1, Y equals 0 to 1, Bi equals bismuth, Sb equals antimony, Se equals selenium, and Te equals tellurium.

18. A method of fabricating a memory device, comprising:
    depositing a first material layer over a substrate, the first material layer comprising bismuth and/or antimony;
    depositing a second material layer over the first material layer, the second material layer comprising ruthenium;
    depositing a third material layer over the second material layer, the third material layer comprising a ferromagnetic material;
    depositing a stack of layers over the third material layer;
    etching through a planar thickness of at least the second material layer, the third material layer, and the stack of layers; and
    annealing the memory device in a chamber that includes a chalcogen element.

19. The method of claim 18, wherein the chalcogen element is selenium and/or tellurium.

20. The method of claim 18, further comprising depositing a capping conductive layer over the stack of layers.

21. The method of claim 18, wherein the annealing converts the first material layer into a topologically insulating compound.

22. The method of claim 18, wherein depositing the second material layer comprises depositing the second material layer at a thickness between 0.5 nm and 5 nm.

23. The method of claim 18, wherein the ferromagnetic material comprises iron and either nickel or cobalt.

* * * * *